United States Patent
Lee

(10) Patent No.: US 11,462,274 B2
(45) Date of Patent: Oct. 4, 2022

(54) SEMICONDUCTOR MEMORY DEVICE REDUCING BIT LINE PRECHARGE OPERATION TIME AND METHOD OF OPERATING THE SAME

(71) Applicant: SK hynix Inc., Icheon-si (KR)

(72) Inventor: Hee Joo Lee, Icheon-si (KR)

(73) Assignee: SK hynix Inc., Icheon-si (KR)

(*) Notice: Subject to any disclaimer, the term of this patent is extended or adjusted under 35 U.S.C. 154(b) by 17 days.

(21) Appl. No.: 16/917,499

(22) Filed: Jun. 30, 2020

(65) Prior Publication Data
US 2021/0202010 A1    Jul. 1, 2021

(30) Foreign Application Priority Data
Dec. 26, 2019    (KR) .................. 10-2019-0175710

(51) Int. Cl.
| G11C 16/24 | (2006.01) |
| G11C 16/08 | (2006.01) |
| G11C 16/04 | (2006.01) |

(52) U.S. Cl.
CPC .......... *G11C 16/24* (2013.01); *G11C 16/0483* (2013.01); *G11C 16/08* (2013.01)

(58) Field of Classification Search
CPC ......... G11C 16/10; G11C 16/08; G11C 16/26; G11C 16/30; G11C 16/24
See application file for complete search history.

(56) References Cited

U.S. PATENT DOCUMENTS

| 6,504,757 B1 * | 1/2003 | Hollmer | G11C 16/0483 365/185.17 |
| 10,483,323 B2 * | 11/2019 | Park | H01L 27/11556 |
| 2008/0151633 A1 * | 6/2008 | Park | G11C 16/3427 365/185.25 |
| 2009/0086542 A1 * | 4/2009 | Lee | G11C 16/24 365/185.25 |
| 2009/0316489 A1 * | 12/2009 | Han | G11C 11/5642 365/185.25 |
| 2010/0097863 A1 * | 4/2010 | Kim | G11C 16/3454 365/185.18 |
| 2011/0305087 A1 * | 12/2011 | Lee | G11C 16/08 365/185.12 |
| 2014/0219024 A1 * | 8/2014 | Ogi | G11C 16/0408 365/185.11 |
| 2017/0271023 A1 * | 9/2017 | Maejima | G11C 16/3436 |
| 2018/0197587 A1 * | 7/2018 | Lee | G11C 11/5628 |
| 2020/0168276 A1 * | 5/2020 | Yang | G11C 16/3427 |
| 2020/0321055 A1 * | 10/2020 | Yang | G11C 16/12 |
| 2021/0027849 A1 * | 1/2021 | Park | G11C 16/08 |
| 2021/0118488 A1 * | 4/2021 | Kim | G11C 11/4093 |

FOREIGN PATENT DOCUMENTS

KR    101718153 B1    3/2017

* cited by examiner

*Primary Examiner* — Sung Il Cho
(74) *Attorney, Agent, or Firm* — William Park & Associates Ltd.

(57) ABSTRACT

A semiconductor memory device, and a method of operation, include: a memory block coupled with a plurality of word lines and a plurality of bit lines; a peripheral circuit configured to perform a program operation and a read operation on the memory block; and control logic configured to control the peripheral circuit such that a word line overdrive period overlaps with a bit line overdrive period in a bit line precharge operation during at least one of the program operation and the read operation.

16 Claims, 10 Drawing Sheets

SEMICONDUCTOR MEMORY DEVICE REDUCING BIT LINE PRECHARGE OPERATION TIME AND METHOD OF OPERATING THE SAME

CROSS-REFERENCE TO RELATED APPLICATION

The present application claims priority under 35 U.S.C. § 119(a) to Korean patent application number 10-2019-0175710, filed on Dec. 26, 2019, in the Korean Intellectual Property Office, the entire disclosure of which is incorporated herein by reference.

BACKGROUND

1. Technical Field

Various embodiments of the present disclosure relate to an electronic device, and more particularly, to a semiconductor memory device and a method of operating the semiconductor memory device.

2. Related Art

Semiconductor devices, in particular, semiconductor memory devices, are classified as volatile memory devices or nonvolatile memory devices.

Although read and write speeds are comparatively low, the nonvolatile memory device can retain stored data even when a power supply is interrupted. Therefore, the nonvolatile memory device is used when there is the need for storing data which must be maintained regardless of a supply of power. Representative examples of nonvolatile memory devices include a read-only memory (ROM), a mask ROM (MROM), a programmable ROM (PROM), an erasable programmable ROM (EPROM), an electrically erasable programmable ROM (EEPROM), a flash memory, a phase-change random access memory (PRAM), a magnetic RAM (MRAM), a resistive RAM (RRAM), a ferroelectric RAM (FRAM), etc. Flash memory is classified as a NOR type or a NAND type.

Flash memory has both advantages of RAM in which data is programmable and erasable and advantages of ROM in which stored data is retained even in the absence of power. Flash memory is widely used as a storage medium for portable electronic devices such as digital cameras, personal digital assistants (PDAs) and MP3 players.

Flash memory devices may be classified as two-dimensional semiconductor memory devices, in which memory strings are horizontally formed on a semiconductor substrate, and three-dimensional semiconductor memory devices, in which memory strings are vertically formed on a semiconductor substrate.

The three-dimensional semiconductor memory device was devised to overcome a limitation in the degree of integration of the two-dimensional semiconductor device and includes a plurality of memory strings which are vertically formed on a semiconductor substrate. Each of the memory strings includes a drain select transistor, memory cells, and a source select transistor, all of which are coupled in series between a bit line and a source line.

SUMMARY

In accordance with an embodiment of the present disclosure is a semiconductor memory device including a memory block coupled with a plurality of word lines and a plurality of bit lines. The semiconductor memory device also includes a peripheral circuit configured to perform a program operation and a read operation on the memory block. The semiconductor memory device further includes control logic configured to control the peripheral circuit such that a word line overdrive period overlaps with a bit line overdrive period in a bit line precharge operation during at least one of the program operation and the read operation.

In accordance with an embodiment of the present disclosure is a semiconductor memory device including a memory block coupled with a plurality of word lines and a plurality of bit lines. The semiconductor memory device also includes a peripheral circuit configured to apply a set voltage to each of the plurality of word lines and the plurality of bit lines. The semiconductor memory device further includes control logic configured to control the peripheral circuit such that, during a bit line precharge operation, a word line overdrive period in which a first overdrive voltage is applied to a selected word line among the plurality of word lines partially overlaps with a bit line overdrive period in which a second overdrive voltage is applied to each of the plurality of bit lines.

In accordance with an embodiment of the present disclosure is a method of operating a semiconductor memory device. The method includes applying a first overdrive voltage to a selected word line during a word line overdrive period, applying a second overdrive voltage to each of multiple bit lines during a bit line overdrive period, applying a first target voltage to the selected word line after the word line overdrive period, and precharging the multiple bit lines to a second target voltage after the bit line overdrive period. The word line overdrive period partially overlaps with the bit line overdrive period.

DETAILED DESCRIPTION

Specific structural or functional descriptions in the embodiments of the present disclosure introduced in this specification or application are only for description of the embodiments of the present disclosure. The descriptions should not be construed as being limited to the embodiments described in the specification or application.

Various embodiments of the present disclosure will now be described with reference to the accompanying drawings, in which embodiments of the present disclosure are shown, so that those of ordinary skill in the art can carry out the technical idea of the present disclosure.

A number of embodiments of the present disclosure are directed to a semiconductor memory device capable of reducing the time it takes to perform an operation of precharging bit lines during an operation of the semiconductor memory device. Additional embodiments are directed to a method of operating such a semiconductor memory device.

Figure 1:
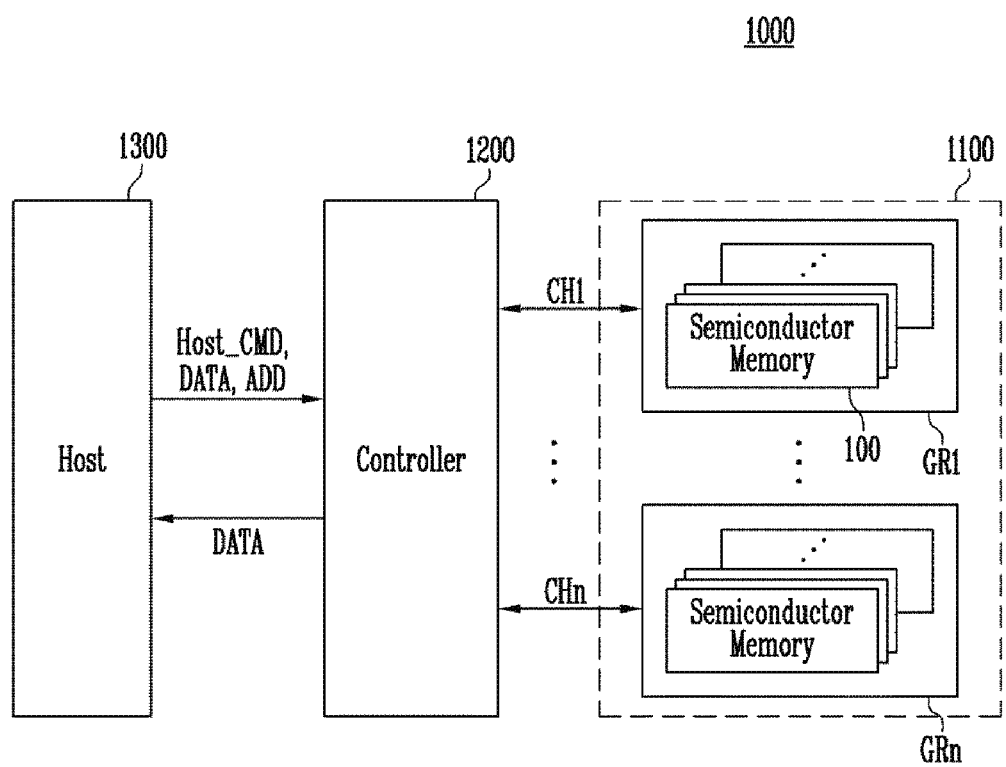
FIG. 1 is a block diagram illustrating a memory system including a semiconductor memory device in accordance with an embodiment of the present disclosure.

FIG. 1 is a block diagram for describing a memory system 1000 including a semiconductor memory device 1100 in accordance with an embodiment of the present disclosure.

Referring to FIG. 1, the memory system 1000 may include the memory device 1100, a controller 1200, and a host 1300. The memory device 1100 may include a plurality of semiconductor memory devices 100. The plurality of semiconductor memory devices 100 may be divided into a plurality of groups GR1 to GRn. Although in the present embodiment, the host 1300 has been illustrated and described as being included in the memory system 1000, the memory system 1000 may include only the controller 1200 and the memory device 1100, and the host 1300 may be disposed outside the memory system 1000.

In FIG. 1, it is illustrated that the plurality of groups GR1 to GRn of the memory device 1100 communicate with the controller 1200 through first to n-th channels CH1 to CHn, respectively. Each semiconductor memory device 100 will be described below with reference to FIG. 2.

Each of the plurality of groups GR1 to GRn may communicate with the controller 1200 through a common channel. The controller 1200 may control the plurality of semiconductor memory devices 100 of the memory device 1100 through the plurality of channels CH1 to CHn.

In each of the plurality of semiconductor memory devices 100 included in the memory device 1100 according to an embodiment of the present disclosure, when a bit line precharge operation of precharging bit lines is performed during overall operations, such as a program operation and a read operation, an overdrive period of a word line and an overdrive period of a bit line may overlap with each other so that the time it takes to perform the bit line precharge operation can be reduced. Consequently, the operating speed of the semiconductor memory device 100 may be improved. For example, during the bit line precharge operation, an overdrive voltage may be applied to the word line and, thereafter, a bit line overdrive voltage may be applied to the bit line before the overdrive period of the word line is terminated. In other words, during the bit line precharge operation, the semiconductor memory device 100 may start an overdrive period of the bit line before the overdrive period of the word line is terminated.

The controller 1200 is coupled between the host 1300 and the memory device 1100. The controller 1200 may access the memory device 1100 in response to a request from the host 1300. For example, the controller 1200 may control a read operation, a write operation, an erase operation, and a background operation of the memory device 1100 in response to a host command Host_CMD received from the host 1300. The host 1300 may transmit an address ADD and data DATA along with the host command Host_CMD during a write operation, and may transmit an address ADD along with the host command Host_CMD during a read operation. During the write operation, the controller 1200 may transmit, to the memory device 1100, a command corresponding to the write operation and data DATA to be programmed. During the read operation, the controller 1200 may transmit a command corresponding to the read operation to the memory device 1100, receive read data DATA from the memory device 1100, and transmit the received data DATA to the host 1300. The controller 1200 may provide an interface between the memory device 1100 and the host 1300. The controller 1200 may run firmware for controlling the memory device 1100.

The host 1300 may include, for example, a portable electronic device such as a computer, a personal digital assistant (PDA), a portable multimedia player (PMP), an MP3 player, a camera, a camcorder, or a mobile phone. The host 1300 may use a host command Host_CMD to make a request for a write operation, a read operation, an erase operation, etc. of the memory system 1000. To perform a write operation of the memory device 1100, the host 1300 may transmit, to the controller 1200, a host command Host_CMD, data DATA, and an address ADD corresponding to the write operation. To perform a read operation, the host 1400 may transmit, to the controller 1200, a host command Host_CMD, and an address ADD corresponding to a read command. Here, the address ADD may be a logical address of data.

The controller 1200 and the memory device 1100 may be integrated into a single semiconductor memory device. In an embodiment, the controller 1200 and the memory device 1100 may be integrated into a single semiconductor memory device to form a memory card. For example, the controller 1200 and the memory device 1100 may be integrated into a single semiconductor memory device and form a memory card such as a personal computer memory card international association (PCMCIA), a compact flash card (CF), a smart media card (SM or SMC), a memory stick multimedia card (MMC, RS-MMC, or MMCmicro), a SD card (SD, miniSD, microSD, or SDHC), or a universal flash storage (UFS).

In an embodiment, the memory system 1000 may be provided as one of various elements of an electronic device such as a computer, a ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, one of various elements for forming a computing system, or the like.

In an embodiment, the memory device 1100 or the memory system 1000 may be embedded in various types of packages. For example, the memory device 1100 or the memory system 1000 may be packaged in a type such as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), or Wafer-Level Processed Stack Package (WSP).

Figure 2:
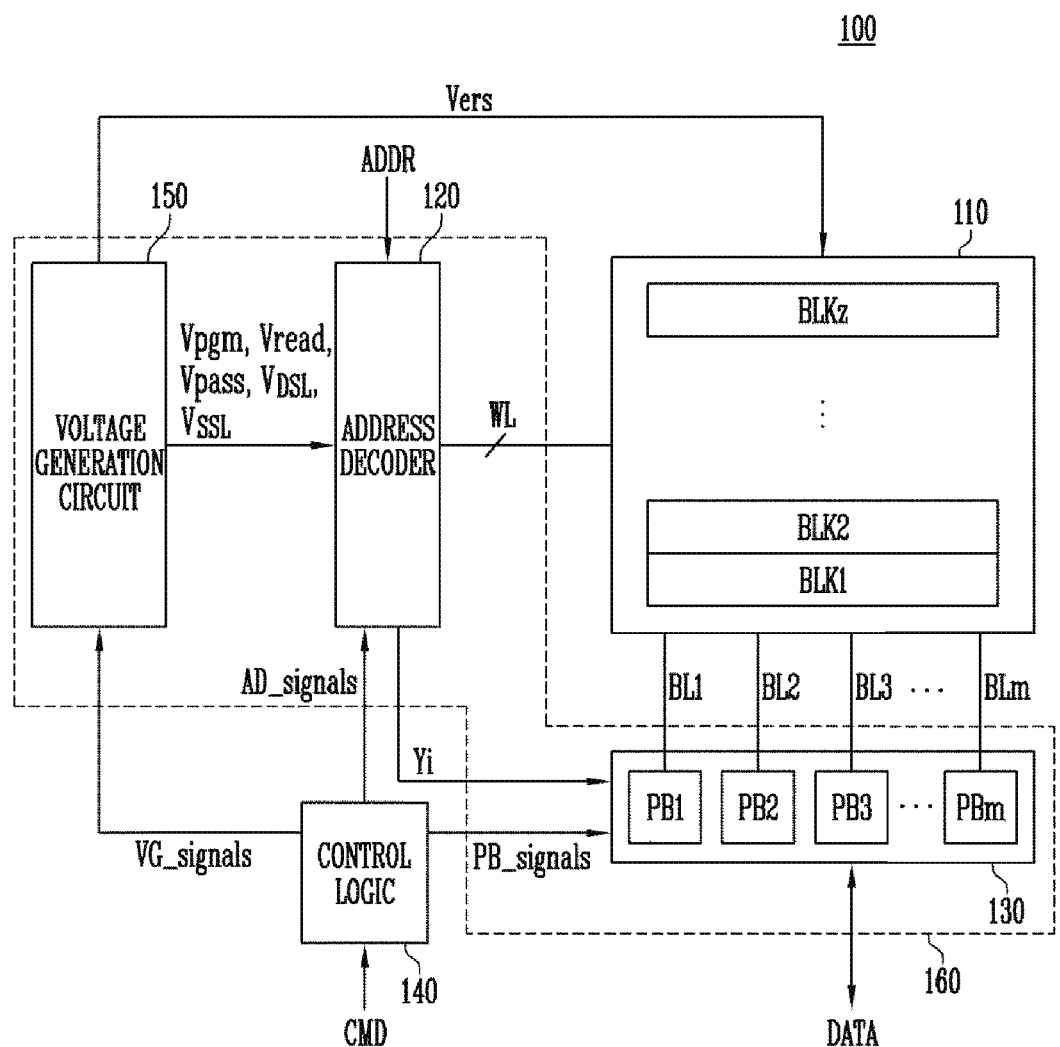
FIG. 2 is a diagram illustrating a semiconductor memory device in accordance with an embodiment of the present disclosure.

FIG. 2 is a diagram illustrating the semiconductor memory device 100 in accordance with an embodiment of the present disclosure.

Referring to FIG. 2, the semiconductor memory device 100 may include a memory cell array 110, an address decoder 120, a read/write circuit 130, control logic 140, and a voltage generation circuit 150. The address decoder 120, the read/write circuit 130, and the voltage generation circuit 150 may be defined as a peripheral circuit 160 configured to perform a program operation on the memory cell array 110.

The memory cell array 110 may include a plurality of memory blocks BLK1 to BLKz. The memory blocks BLK1 to BLKz are coupled to the address decoder 120 through word lines WL. The memory blocks BLK1 to BLKz may be coupled to the read/write circuit 130 through bit lines BL1 to BLm. Each of the memory blocks BLK1 to BLKz may include a plurality of memory cells. In an embodiment, the plurality of memory cells may be nonvolatile memory cells. Memory cells coupled to one word line among the plurality of memory cells are defined as one page. In other words, the memory cell array 110 may be formed of a plurality of pages.

Each of the memory blocks BLK1 to BLKz of the memory cell array 110 includes a plurality of memory strings. Each of the memory strings includes a drain select transistor, a plurality of memory cells, and a source select transistor which are coupled in series between a bit line and a source line. Furthermore, each of the plurality of memory strings may include pass transistors respectively provided between the source select transistor and the memory cells and between the drain select transistor and the memory cells, and may further include a pipe gate transistor between the memory cells. The memory cell array 110 will be described in detail later herein.

The address decoder 120 may be coupled to the memory cell array 110 through the word lines WL. The address decoder 120 may be operated in response to address decoder control signals AD_signals generated from the control logic 140. The address decoder 120 may receive addresses ADDR through an input/output buffer (not shown) provided in the semiconductor memory device 100.

During a bit line precharge operation in a program operation or a read operation, the address decoder 120 may apply a plurality of operating voltages including a program voltage Vpgm or a read voltage Vread, a pass voltage Vpass, a drain select line voltage $V_{DSL}$, and a source select line voltage $V_{SSL}$, generated by the voltage generation circuit 150, to a plurality of memory cells, drain select transistors, and source select transistors of the memory cell array 110 in response to a decoded row address obtained by decoding a row address of the received addresses ADDR.

The address decoder 120 may decode a column address among the received addresses ADDR. The address decoder 120 transmits the decoded column address Yi to the read/write circuit 130.

The addresses ADDR received during the program operation or the read operation includes a block address, a row address, and a column address. The address decoder 120 may select one memory block and one word line based on the block address and the row address. The column address may be decoded by the address decoder 120 and provided to the read/write circuit 130.

The address decoder 120 may include a block decoder, a row decoder, a column decoder, an address buffer, etc.

The read/write circuit 130 may include a plurality of page buffers PB1 to PBm. The plurality of page buffers PB1 to PBm may be coupled to the memory cell array 110 through the bit lines BL1 to BLm. During a program operation, each of the page buffers PB1 to PBm may temporarily store data DATA that is received from the controller 1200 of FIG. 1 and is to be programmed, and control a potential level of a corresponding one of the bit lines BL1 to BLm in accordance with the temporarily stored program data DATA. Furthermore, during a read operation, the read/write circuit 130 may sense the potential levels or the currents of the bit lines BL1 to BLm to perform the read operation, and output the read data DATA to the controller 1200 of FIG. 1.

Each of the plurality of page buffers PB1 to PBm may precharge a corresponding bit line of the bit lines BL1 to BLm to a set level during a bit line precharge operation in the program operation or the read operation, and rapidly precharge the bit lines by applying overdrive voltages to the bit lines during a bit line overdrive period in the bit line precharge operation.

The read/write circuit 130 may operate in response to page buffer control signals PB_signals output from the control logic 140.

In an embodiment, the read/write circuit 130 may include page buffers (or page registers), a column select circuit, etc.

During the program operation, the voltage generation circuit 150 may generate a plurality of operating voltages including a program voltage Vpgm, a pass voltage Vpass, a drain select line voltage $V_{DSL}$, and a source select line voltage $V_{SSL}$ under control of voltage generation circuit control signals VG_signals output from the control logic 140, and output the plurality of operating voltages to the address decoder 120. During the read operation, the voltage generation circuit 150 may generate a plurality of operating voltages including a read voltage Vread, a pass voltage Vpass, a drain select line voltage $V_{DSL}$, and a source select line voltage $V_{SSL}$ under control of voltage generation circuit control signals VG_signals output from the control logic 140, and output the plurality of operating voltages to the address decoder 120.

During the bit line precharge operation in the program operation or the read operation, the voltage generation circuit 150 may generate a pass voltage Vpass to be applied to unselected word lines and generate an operating voltage (a program voltage Vpgm or a read voltage Vread) to be applied to a selected word line. During the word line overdrive period in the bit line precharge operation, the voltage generation circuit 150 may generate an overdrive voltage to be applied to the selected word line. The overdrive voltage may have a potential level higher than the operating voltage Vpgm or Vread.

In addition, during an erase operation, the voltage generation circuit 150 may generate an erase voltage Vers and provide the erase voltage Vers to the memory cell array 110.

The control logic 140 may be coupled to the address decoder 120, the read/write circuit 130, and the voltage generation circuit 150. The control logic 140 may receive a command CMD through an input/output buffer (not shown)

of the semiconductor memory device 100. The control logic 140 may control the overall operation of the semiconductor memory device 100 in response to the command CMD. For example, the control logic 140 may receive a command CMD corresponding to a program operation or a read operation, and then generate and output, in response to the received command CMD, address decoder control signals AD_signals for controlling the address decoder 120, page buffer control signals PB_signals for controlling the read/write circuit 130, and voltage generation circuit control signals VG_signals for controlling the voltage generation circuit 150.

The control logic 140 in accordance with an embodiment of the present disclosure may control the address decoder 120, the read/write circuit 130, and the voltage generation circuit 150 so that, during the bit line precharge operation in the program operation or the read operation, the word line overdrive period in which an overdrive voltage is applied to the selected word line may overlap with the bit line overdrive period in which overdrive voltages are applied to the bit lines. The control logic 140 may be implemented as hardware, software, or a combination of hardware and software. For example, the control logic 140 may be a control logic circuit operating in accordance with an algorithm and/or a processor executing control logic code.

Figure 3:
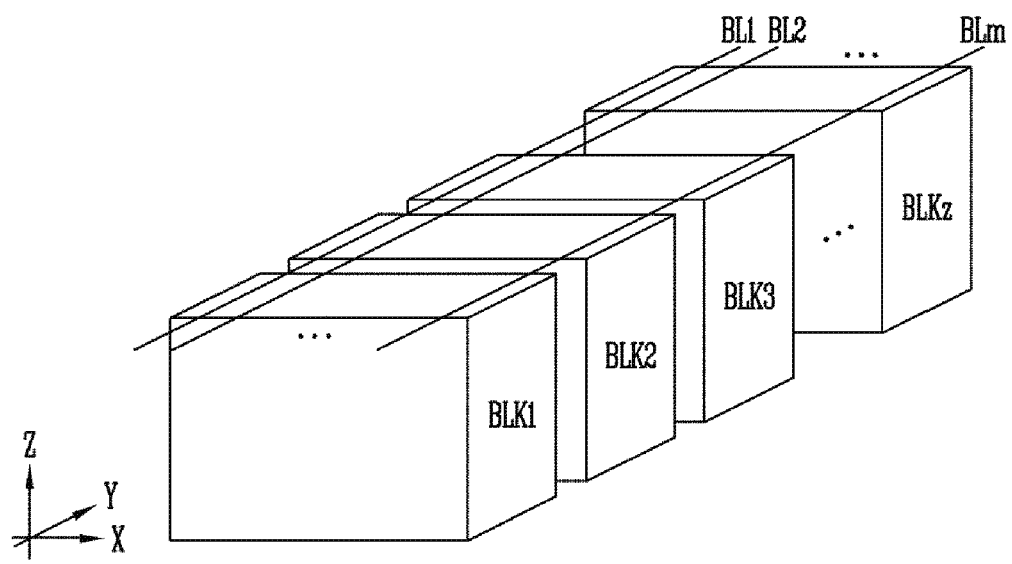
FIG. 3 is a diagram illustrating memory blocks each having a three-dimensional structure.

FIG. 3 is a diagram illustrating memory blocks BLK1 to BLKz each having a three-dimensional structure.

Referring to FIG. 3, the memory blocks BLK1 to BLKz may be arranged at positions spaced apart from each other in a direction Y in which bit lines BL1 to BLm extend. For example, the first to z-th memory blocks BLK1 to BLKz may be arranged at positions spaced apart from each other in a second direction Y, and each may include a plurality of memory cells stacked in a third direction Z. Hereinbelow, the configuration of any one memory block of the first to z-th memory blocks BLK1 to BLKz will be described in detail with reference to FIGS. 4 and 5.

Figure 4:
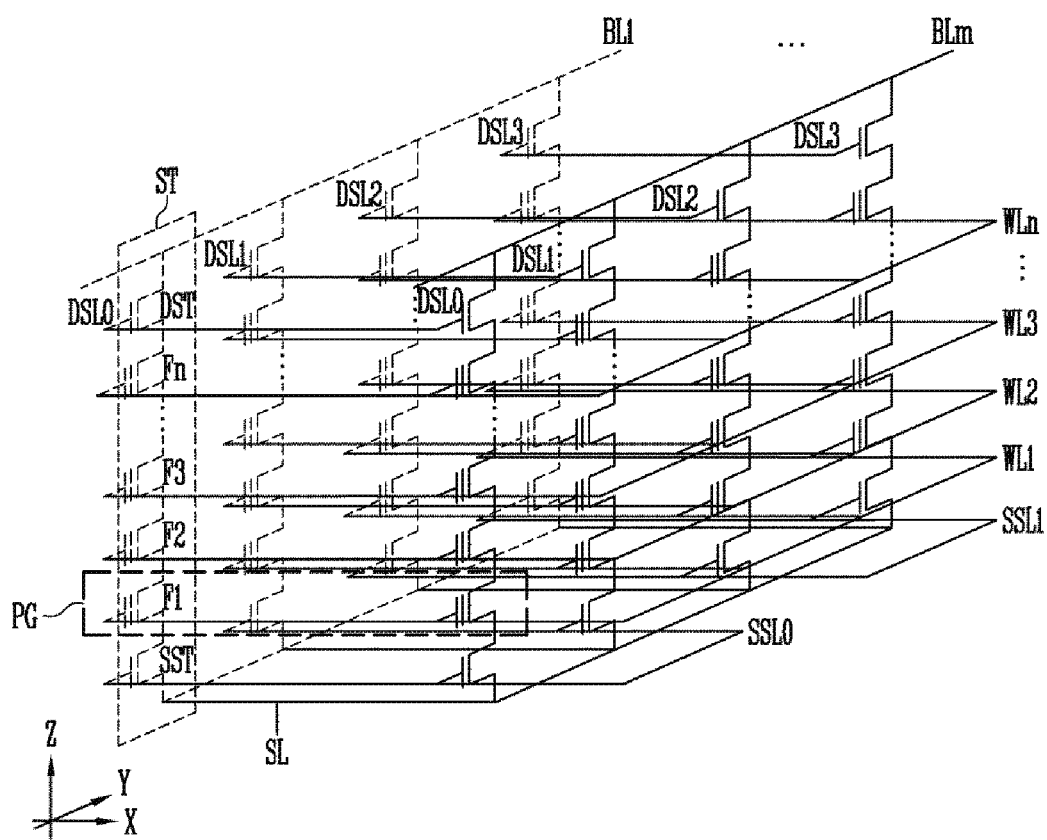
FIG. 4 is a circuit diagram illustrating in detail one of the memory blocks illustrated in FIG. 3.

FIG. 4 is a circuit diagram for describing in detail any one of the memory blocks illustrated in FIG. 3.

Figure 5:
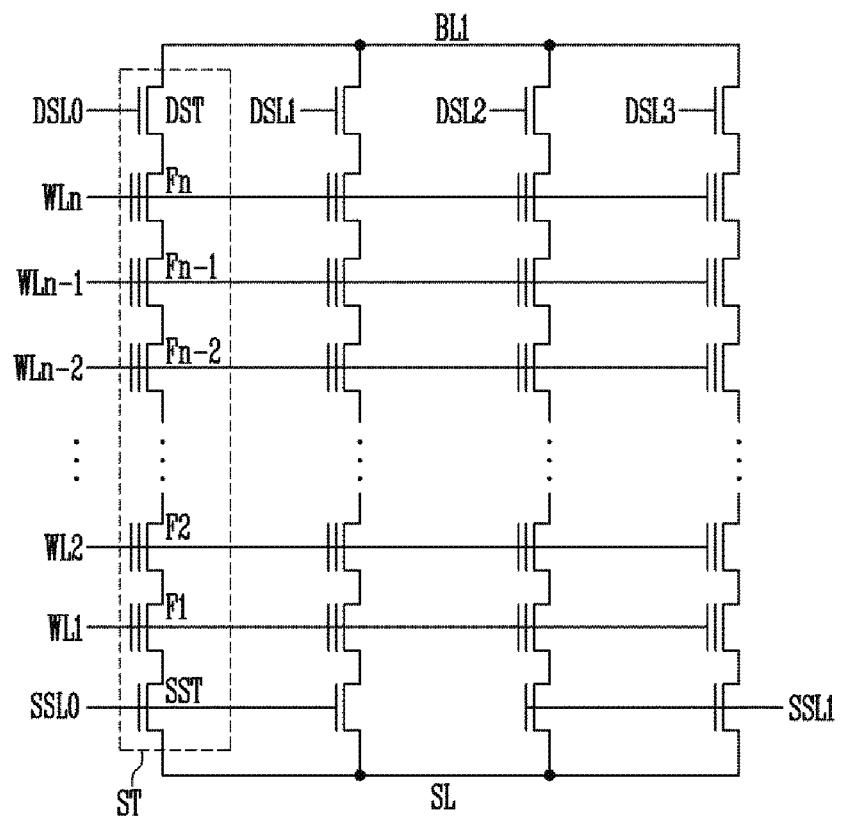
FIG. 5 is a circuit diagram illustrating memory strings of FIG. 4.

FIG. 5 is a circuit diagram illustrating memory strings illustrated in FIG. 4.

Referring to FIGS. 4 and 5, each memory string ST may be coupled between the bit line BL1 to BLm and a source line SL. The memory string ST coupled between the first bit line BL1 and the source line SL will be described below by way of example.

The memory string ST may include a source select transistor SST, memory cells F1 to Fn (n is a positive integer), and a drain select transistor DST, which are coupled in series to each other between the source line SL and the first bit line BL1. Gates of the source select transistors SST included in different memory strings ST coupled to the respective bit lines BL1 to BLm may be coupled to a first source select line SSL0 or a second source select line SSL1. For example, source select transistors disposed adjacent to each other in the second direction Y among the source select transistors SST may be coupled to the same source select line. For example, when it is assumed that the source select transistors SST are successively arranged in the second direction Y, the gates of the source select transistors SST that are arranged in the first direction X from the first source select transistor SST and included in different memory strings ST and the gates of the source select transistors SST that are arranged in the first direction X from the second source select transistor SST and included in different memory strings ST may be coupled to the first source select line SSL0. Furthermore, the gates of the source select transistors SST that are arranged in the first direction X from the third source select transistor SST and included in different memory strings ST and the gates of the source select transistors SST that are arranged in the first direction X from the fourth source select transistor SST and included in different memory strings ST may be coupled to the second source select line SSL1.

Gates of the memory cells F1 to Fn may be coupled to the word lines WL1 to WLn, and gates of the drain select transistors DST may be coupled to any one of the first to fourth drain select lines DSL0 to DSL3.

Although the gates of the transistors that are arranged in the first direction X among the drain select transistors DST are coupled in common to the same drain select line (e.g., DSL0), the transistors that are arranged in the second direction Y may be coupled to different drain select lines DSL1 to DSL3. For example, if it is assumed that the drain select transistors DST are successively arranged in the second direction Y, the gates of the drain select transistors DST that are arranged in the first direction X from the first drain select transistor DST and included in different memory strings ST may be coupled to the first drain select line DSL0. The drain select transistors DST that are arranged in the second direction Y from the drain select transistors DST coupled to the first drain select line DSL0 may be successively coupled to the second to fourth drain select lines DSL1 to DSL3. Therefore, in a selected memory block, memory strings ST coupled to a selected drain select line may be selected, and memory strings ST coupled to the other unselected drain select lines may be unselected.

Memory cells coupled to the same word lines may form one page PG. Here, the term "page" means a physical page. For example, a group of memory cells coupled in the first direction X to the same word line among the memory strings ST coupled to the first to m-th bit line BL1 to BLm may be referred to as "page PG". For example, the memory cells that are arranged in the first direction X among the first memory cells F1 coupled to the first word line WL1 may form one page PG. Cells arranged in the second direction Y among the first memory cells F1 coupled in common to the first word line WL1 may be separated from each other by different pages. Therefore, in the case where the first drain select line DSL0 is a selected drain select line and the first word line WL1 is a selected word line, the page that is coupled to the first drain select line DSL0 among the plurality of pages PG coupled to the first word line WL1 may become a selected page. The pages that are coupled in common to the first word line WL1 and coupled to the unselected second to fourth drain select lines DSL1 to DSL3 may become unselected pages.

Although in the drawing there is illustrated the case where one source select transistor SST and one drain select transistor DST are included in each memory string ST, a plurality of source select transistors SST and a plurality of drain select transistors DST may be included in each memory string ST depending on the configuration of the semiconductor memory device. Furthermore, depending on the configuration of the semiconductor memory device, dummy cells may be provided between the source select transistor SST, the memory cells F1 to Fn, and the drain select transistor DST. Unlike the normal memory cells F1 to Fn, the dummy cells do not store user data, but may be used to improve electrical characteristics of each memory string ST.

Figure 6:
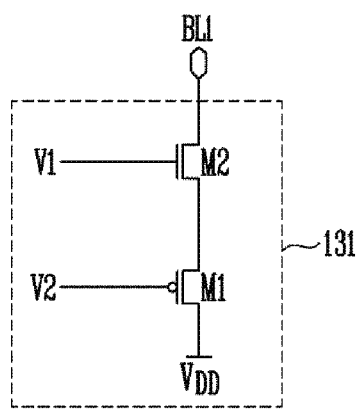
FIG. 6 is a circuit diagram illustrating a bit line precharge circuit included in each of page buffers of FIG. 2.

FIG. 6 is a circuit diagram illustrating a bit line precharge circuit 131 included in each of the page buffers of FIG. 2.

Each of the page buffers PB1 to PBm may include the bit line precharge circuit 131 configured to precharge a corresponding one of the bit lines BL1 to BLm. Herein, the bit line precharge circuit 131 included in the page buffer PB1 will be described by way of example.

The bit line precharge circuit 131 may be coupled with the bit line BL1, and precharge the bit line BL1 by applying a power supply voltage $V_{DD}$ in response to control signals V1 and V2. The control signals V1 and V2 may be included in page buffer control signals PB_signals generated from the control logic 140 of FIG. 2.

The bit line precharge circuit 131 may include a first switch element M1 and a second switch element M2 which are coupled in series between a power supply voltage ($V_{DD}$) terminal and the bit line BL1. The first switch element M1 may be turned on in response to a control signal V2, and the second switch element M2 may be turned on in response to a control signal V1, whereby the power supply voltage $V_{DD}$ may be applied to the bit line BL1. Furthermore, the second switch element M2 may control the amount of current to be applied to the bit line BL1 depending on the potential level of the control signal V1.

For example, during the bit line overdrive period in the bit line precharge operation, the bit line precharge circuit 131 may apply a power supply voltage $V_{DD}$ to the bit line BL1 in response to a control signal V1 having an overdrive potential level and a control signal V2 having a logic low level. Here, in response to the control signal V1 having the overdrive potential level, the potential level of the bit line BL1 may be rapidly increased by applying a comparatively large amount of current to the bit line BL1. Furthermore, during the bit line precharge operation, after the bit line overdrive period has been terminated, the bit line precharge circuit 131 may maintain a precharge level by continuously applying the power supply voltage $V_{DD}$ to the bit line BL1 in response to the control signal V1 having a target level and the control signal V2 having a low logic level. In an embodiment, the target level may be lower than the overdrive potential level.

In an embodiment, the first switch element M1 may be formed of a PMOS transistor, and the second switch element M2 may be formed of an NMOS transistor.

Figure 7:
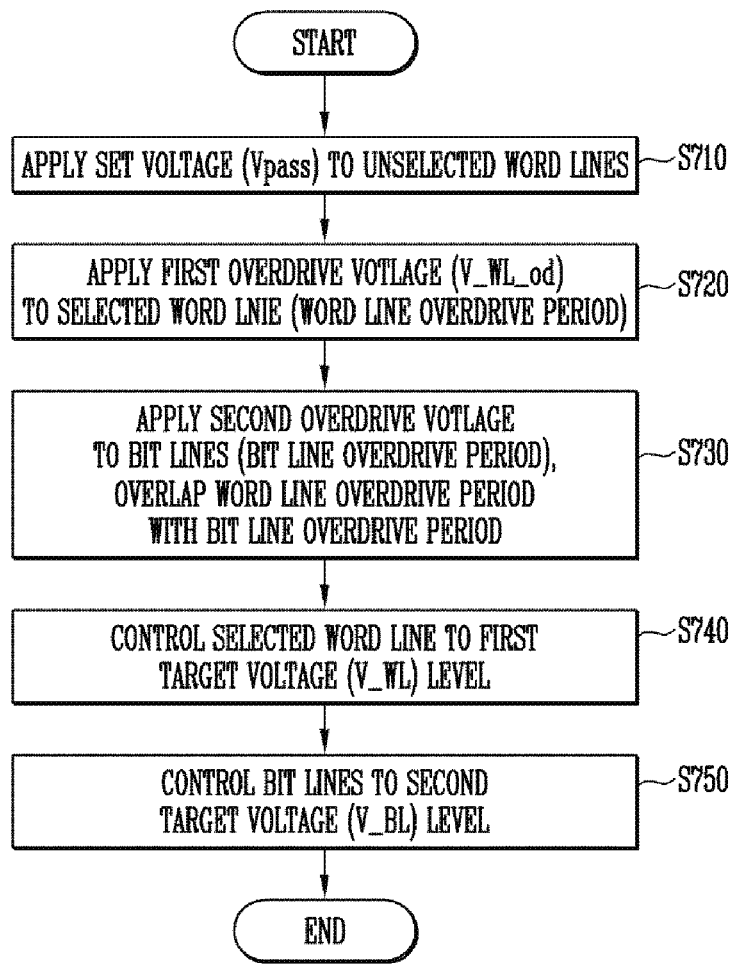
FIG. 7 is a flowchart illustrating a method of operating a semiconductor memory device according to an embodiment of the present disclosure.

FIG. 7 is a flowchart illustrating a method of operating the semiconductor memory device 100 according to an embodiment of the present disclosure.

Figure 8:
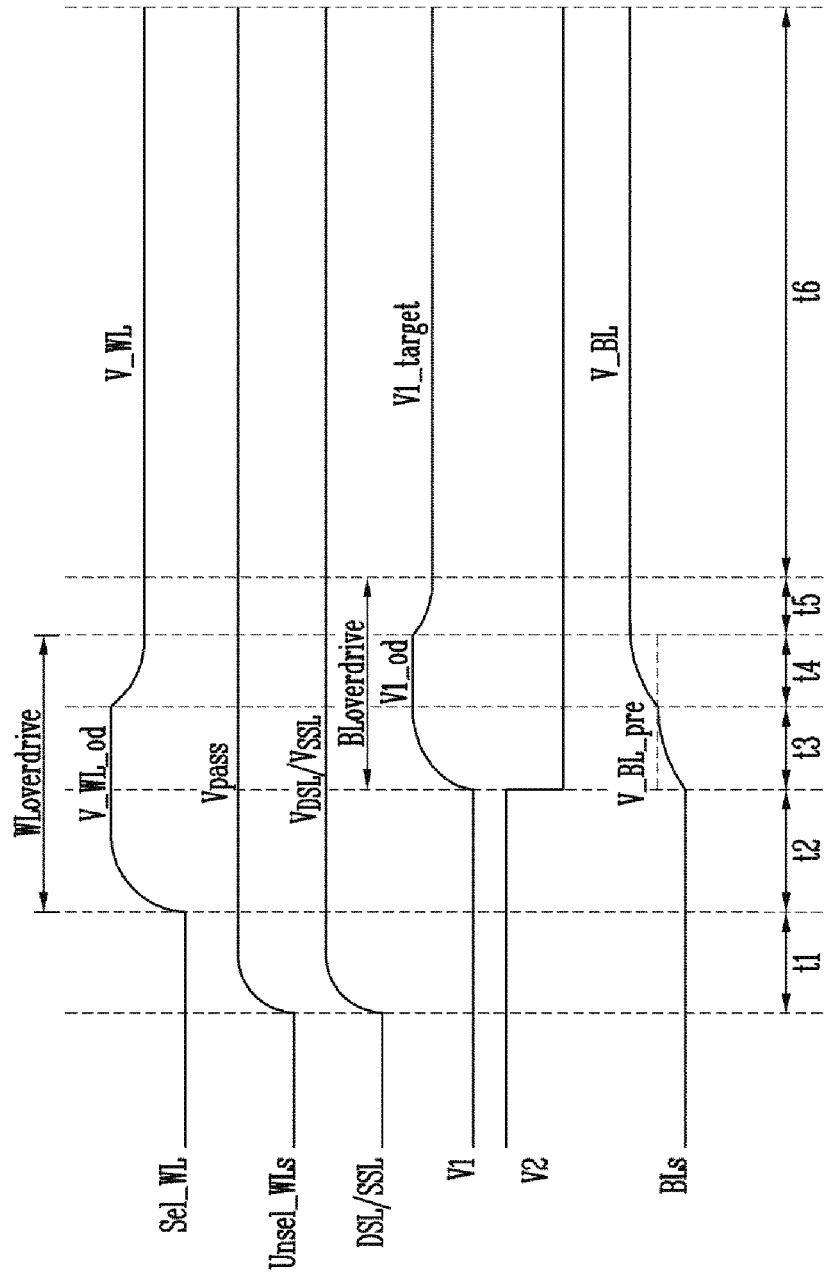
FIG. 8 is a waveform diagram of operating voltages for describing the operating method of the semiconductor memory device according to an embodiment of the present disclosure.

FIG. 8 is a waveform diagram of operating voltages for describing the operating method of the semiconductor memory device 100 according to an embodiment of the present disclosure.

A method of operating the semiconductor memory device 100 according to an embodiment of the present disclosure will be described with reference to FIGS. 1 to 8.

In the present embodiment, a bit line precharge operation that is performed during a read operation will be described.

The control logic 140 may receive a command CMD corresponding to the read operation from the controller 1200, and control the peripheral circuit 160 to perform the read operation in response to the received command CMD.

During a period t1, the voltage generation circuit 150 may generate a set voltage (e.g., Vpass) to be applied to unselected word lines Unsel_WLs (e.g., WL2 to WLn) under control of voltage generation circuit control signals VG_signals. The address decoder 120 may apply the set voltage Vpass generated from the voltage generation circuit 150 to unselected word lines Unsel_WLs (e.g., WL2 to WLn) of the selected memory block (e.g., BLK1) in response to address decoder control signals AD_signals (at step S710).

During a period t2, the voltage generation circuit 150 may generate a first overdrive voltage V_WL_od to be applied to a selected word line Sel_WL (e.g., WL1) under control of voltage generation circuit control signals VG_signals. The first overdrive voltage V_WL_od may have a potential level higher than the level of a first target voltage V_WL of the selected word line Sel_WL (WL1) during the bit line precharge operation. The level of the first target voltage V_WL may be a level of a read voltage Vread.

The address decoder 120 may apply the first overdrive voltage V_WL_od generated from the voltage generation circuit 150 to the selected word line Sel_WL (WL1) of the selected memory block (e.g., BLK1) in response to the address decoder control signals AD_signals (at step S720). The first overdrive voltage V_WL_od may be applied during periods t2, t3, and t4. The periods t2, t3, and t4, during which the first overdrive voltage V_WL_od is applied, may be defined as a word line overdrive period WLoverdrive.

In a period t3 during the word line overdrive period WLoverdrive, bit line precharge circuits 131 included in the respective page buffers PB1 to PBm may apply the power supply voltage $V_{DD}$ to the bit lines BL1 to BLm (BLs) in response to the control signals V1 and V2. Here, the bit line precharge circuits 131 may apply a second overdrive voltage to the bit lines BL1 to BLm (BLs) in response to a control signal V1 having an overdrive potential V1_od (at step S730). The second overdrive voltage may be applied during a period from the period t3 to a period t5. The period in which the second overdrive voltage is applied may be defined as a bit line overdrive period BLoverdrive. The bit line overdrive period BLoverdrive may be a period in which the control signal V1 has an overdrive potential V1_od. A first amount of current to be applied to the bit lines BL1 to BLm (BLs) in the bit line overdrive period BLoverdrive may be greater than a second amount of current to be applied to the bit lines BL1 to BLm (BLs) after the bit line overdrive period BLoverdrive has been terminated (e.g., a period t6).

Here, the first overdrive voltage V_WL_od to be applied to the word line may be higher than the second overdrive voltage to be applied to the bit lines BL1 to BLm (BLs). Therefore, the potential level of each of the bit lines BL1 to BLm (BLs) may be precharged to the level of a pre-bit line voltage V_BL_pre which is lower than a second target voltage V_BL. The word line overdrive period WLoverdrive may be a period in which cell current in the memory string is comparatively large. If the word line overdrive period WLoverdrive overlaps with the bit line overdrive period BLoverdrive, a bit line overshoot phenomenon in which the potential level of each of the bit lines BLs is formed to be higher than the level of the second target voltage V_BL may be prevented from occurring.

The word line overdrive period WLoverdrive and the bit line overdrive period BLoverdrive may overlap with each other in some periods t3 and t4, as illustrated in FIG. 8.

During a period t4, the voltage generation circuit 150 may reduce the potential level of the first overdrive voltage V_WL_od to be applied to the selected word line Sel_WL (e.g., WL1) under control of voltage generation circuit control signals VG_signals and thus control the selected word line Sel WL (WL1) to the first target voltage V_WL (at step S740). As the potential level of the selected word line Sel WL (WL1) is reduced, the precharge level of each of the bit lines BL1 to BLm (BLs) may be increased.

During the period t5, the potential level of the control signal V1 may be reduced to the target level V1_target, and the potential level of each of the bit lines BL1 to BLm (BLs) may be precharged to the second target voltage V_BL (at step S750).

Thereafter, during a period t6, the selected word line Sel_WL may be maintained at the level of the first target voltage V_WL. The bit lines BL1 to BLm (BLs) may be maintained at the level of the second target voltage V_BL.

Figure 9:
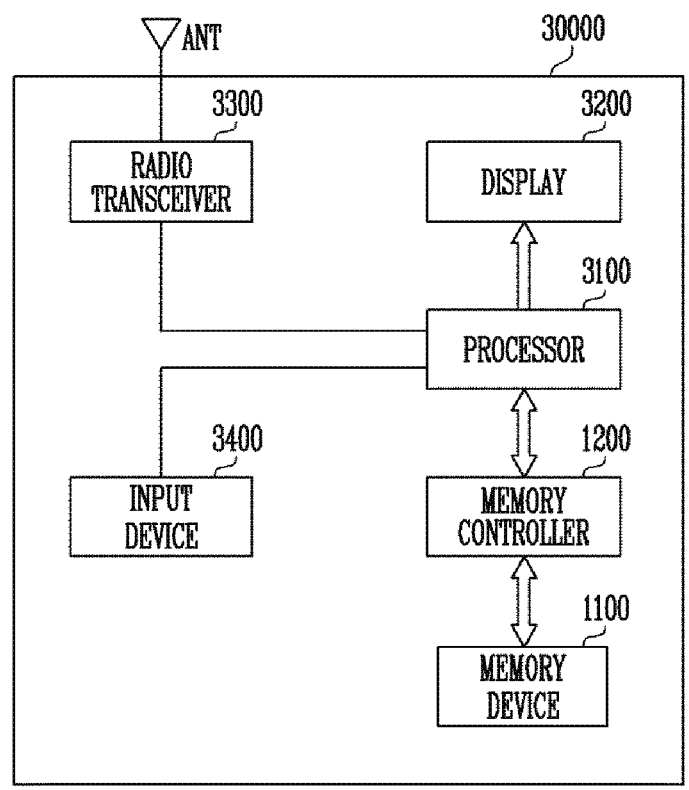
FIG. 9 is a diagram illustrating a memory system in accordance with an embodiment of the present disclosure.

FIG. 9 is a diagram illustrating a memory system 30000 in accordance with an embodiment of the present disclosure.

Referring to FIG. 9, the memory system 30000 may be embodied, for example, in a cellular phone, a smartphone, a tablet PC, a personal digital assistant (PDA) or a wireless communication device. The memory system 30000 may include a memory device 1100 and a memory controller 1200 configured to control the operation of the memory device 1100. The memory controller 1200 may control a data access operation, e.g., a program operation, an erase operation, or a read operation, of the memory device 1100 under control of a processor 3100.

Data programmed in the memory device 1100 may be outputted through a display 3200 under control of the memory controller 1200.

A radio transceiver 3300 may send and receive radio signals through an antenna ANT. For example, the radio transceiver 3300 may change a radio signal received through the antenna ANT into a signal capable of being processed in the processor 3100. Therefore, the processor 3100 may process a signal output from the radio transceiver 3300 and transmit the processed signal to the memory controller 1200 or the display 3200. The memory controller 1200 may program a signal processed by the processor 3100 to the memory device 1100. Furthermore, the radio transceiver 3300 may change a signal output from the processor 3100 into a radio signal, and output the changed radio signal to an external device through the antenna ANT. An input device 3400 may be used to input a control signal for controlling the operation of the processor 3100 or data to be processed by the processor 3100. The input device 3400 may be embodied in a pointing device, such as a touch pad or a computer mouse, a keypad, or a keyboard. The processor 3100 may control the operation of the display 3200 such that data output from the memory controller 1200, data output from the radio transceiver 3300, or data output from the input device 3400 is output through the display 3200.

In an embodiment, the memory controller 1200 capable of controlling the operation of the memory device 1100 may be embodied as a part of the processor 3100 or a chip provided separately from the processor 3100. The memory controller 1200 may be implemented using the example of the controller 1200 shown in FIG. 1.

Figure 10:
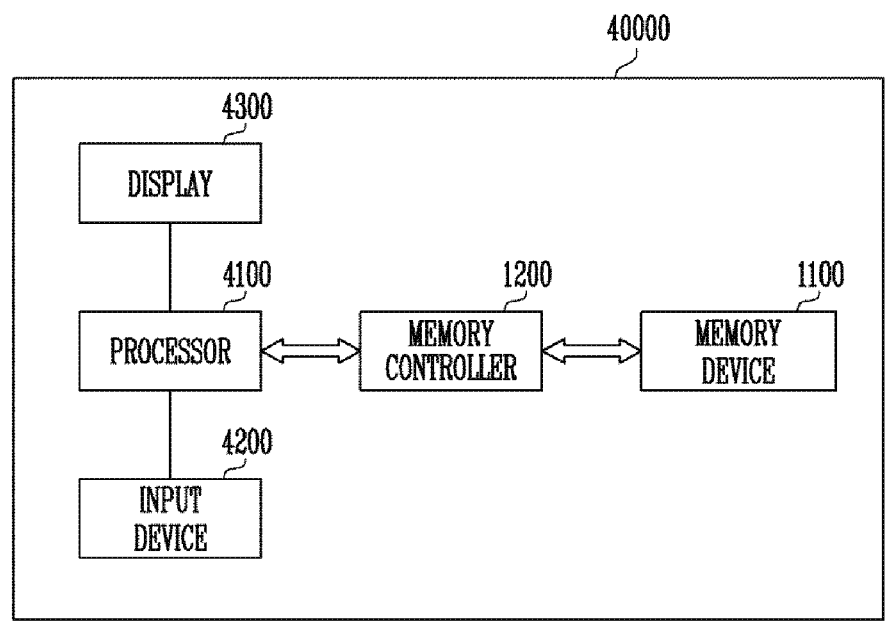
FIG. 10 is a diagram illustrating a memory system in accordance with an embodiment of the present disclosure.

FIG. 10 is a diagram illustrating a memory system 40000 in accordance with an embodiment of the present disclosure.

Referring to FIG. 10, the memory system 40000 may be embodied, for example, in a personal computer (PC), a tablet PC, a net-book, an e-reader, a personal digital assistant (PDA), a portable multimedia player (PMP), an MP3 player, or an MP4 player.

The memory system 40000 may include a memory device 1100 and a memory controller 1200 configured to control the data processing operation of the memory device 1100.

A processor 4100 may output data stored in the memory device 1100 through a display 4300, according to data inputted from an input device 4200. For example, the input device 4200 may be embodied in a pointing device, such as a touch pad or a computer mouse, a keypad, or a keyboard.

The processor 4100 may control the overall operation of the memory system 40000 and control the operation of the memory controller 1200. In an embodiment, the memory controller 1200 capable of controlling the operation of the memory device 1100 may be embodied as a part of the processor 4100 or a chip provided separately from the processor 4100. The memory controller 1200 may be implemented using the example of the controller 1200 shown in FIG. 1.

Figure 11:
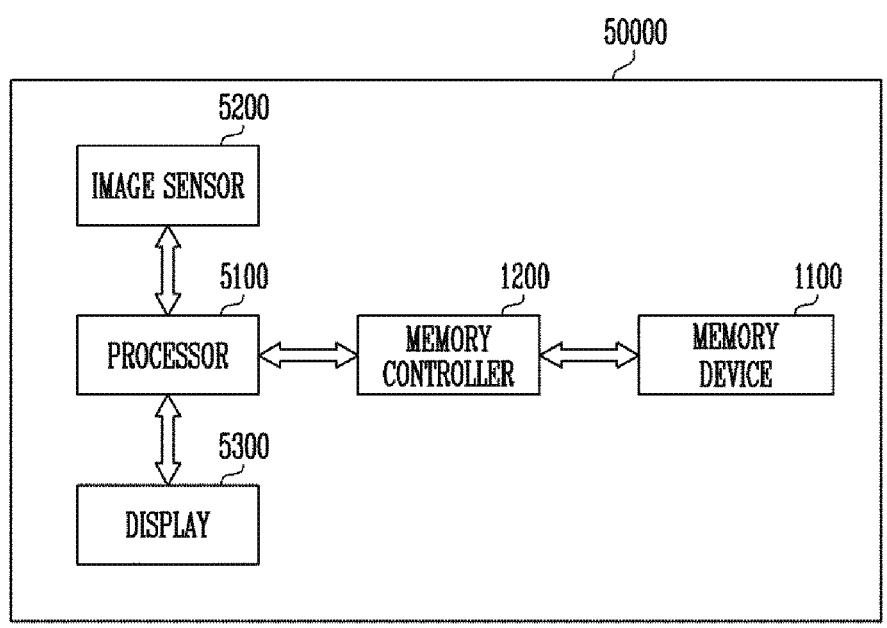
FIG. 11 is a diagram illustrating a memory system in accordance with an embodiment of the present disclosure.

FIG. 11 is a diagram illustrating a memory system 50000 in accordance with an embodiment of the present disclosure.

Referring to FIG. 11, the memory system 50000 may be embodied, for example, in an image processing device, e.g., a digital camera, a portable phone provided with a digital camera, a smartphone provided with a digital camera, or a tablet PC provided with a digital camera.

The memory system 50000 may include the memory device 1100 and a memory controller 1200 capable of controlling a data processing operation, e.g., a program operation, an erase operation, or a read operation, of the memory device 1100.

An image sensor 5200 of the memory system 50000 may convert an optical image into digital signals. The converted digital signals may be transmitted to a processor 5100 or the memory controller 1200. Under control of the processor 5100, the converted digital signals may be outputted through a display 5300 or stored in the memory device 1100 through the controller 1200. Data stored in the memory device 1100 may be outputted through the display 5300 under control of the processor 5100 or the memory controller 1200.

In an embodiment, the memory controller 1200 capable of controlling the operation of the memory device 1100 may be embodied as a part of the processor 5100 or a chip provided separately from the processor 5100. The memory controller 1200 may be implemented using the example of the controller 1200 shown in FIG. 1.

Figure 12:
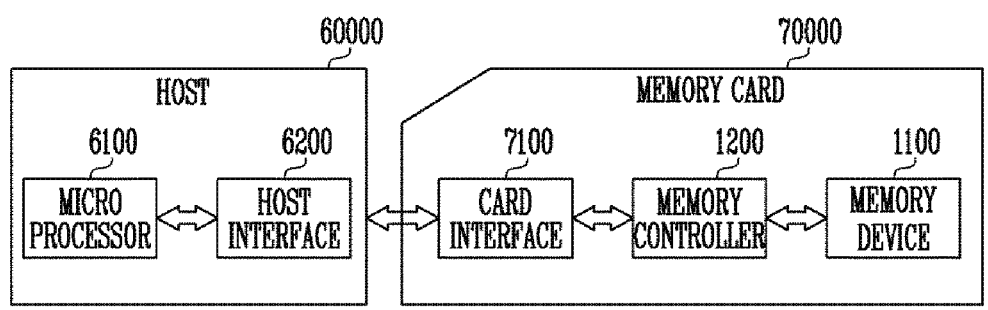
FIG. 12 is a diagram illustrating a memory system in accordance with an embodiment of the present disclosure.

FIG. 12 is a diagram illustrating a memory system 70000 in accordance with an embodiment of the present disclosure.

Referring to FIG. 12, the memory system 70000 may be embodied, for example, in a memory card or a smart card. The memory system 70000 may include a memory device 1100, a memory controller 1200, and a card interface 7100.

The controller 1200 may control data exchange between the memory device 1100 and the card interface 7100. In an embodiment, the card interface 7100 may be a secure digital (SD) card interface or a multi-media card (MMC) interface, but it is not limited thereto. The memory controller 1200 may be implemented using the example of the controller 1200 shown in FIG. 1.

The card interface 7100 may interface data exchange between a host 60000 and the memory controller 1200 according to a protocol of the host 60000. In an embodiment, the card interface 7100 may support a universal serial bus (USB) protocol, and an interchip (IC)-USB protocol. Here, the card interface may refer to hardware capable of supporting a protocol which is used by the host 60000, software installed in the hardware, or a signal transmission scheme.

When the memory system 70000 is connected to a host interface 6200 of the host 60000 such as a PC, a tablet PC, a digital camera, a digital audio player, a cellular phone, console video game hardware or a digital set-top box, the host interface 6200 may perform data communication with the memory device 1100 through the card interface 7100 and the memory controller 1200 under control of a microprocessor 6100.

In an embodiment of the present disclosure, an overdrive period of a word line partially overlaps with an overdrive period of bit lines, so that the time it takes to perform an operation of precharging the bit lines can be reduced.

Consequently, the operating speed of a semiconductor memory device may be improved.

Embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A semiconductor memory device comprising:
   a memory block coupled with a plurality of word lines and a plurality of bit lines;
   a peripheral circuit configured to perform a program operation and a read operation on the memory block; and
   control logic configured to control the peripheral circuit to apply a first overdrive voltage which is greater than a first target voltage to read data stored in memory cells connected to a selected word line among the plurality of word lines and then apply the first target voltage to the selected word line, and to apply a second overdrive voltage which is greater than a second target voltage and then apply the second target voltage to each of the bit lines in a bit line precharge operations during the read operation;
   wherein the control logic controls the peripheral circuit such that a word line overdrive period in which the overdrive voltage is applied to the selected word line overlaps with a bit line overdrive period in which the overdrive voltage is applied to each of the bit lines during the read operation.

2. The semiconductor memory device according to claim 1, wherein the control logic is configured to control the peripheral circuit to apply a first amount of current to each of the bit lines during the bit line overdrive period.

3. The semiconductor memory device according to claim 2,
   wherein the control logic is configured to control the peripheral circuit to apply a second amount of current to each of the bit lines after the bit line overdrive period has terminated, and
   wherein the second amount of current is less than the first amount of current.

4. The semiconductor memory device according to claim 1,
   wherein the control logic is configured to control the peripheral circuit to apply the first overdrive voltage and then apply the first target voltage to the selected word line during the word line overdrive period, and to apply the second overdrive voltage and then apply the second target voltage to each of the bit lines during the bit line overdrive period, and
   wherein the second overdrive voltage is lower than the first overdrive voltage.

5. The semiconductor memory device according to claim 4, wherein the control logic is configured to, during a period in which the word line overdrive period overlaps with the bit line overdrive period, precharge each of the bit lines to a voltage level lower than the second target voltage.

6. The semiconductor memory device according to claim 5, wherein the control logic is configured to, when the period in which the word line overdrive period overlaps with the bit line overdrive period is terminated, precharge each of the bit lines to the second target voltage.

7. The semiconductor memory device according to claim 5, wherein the peripheral circuit comprises:
   a voltage generation circuit configured to apply the first overdrive voltage to the selected word line among the word lines; and
   a bit line precharge circuit configured to apply the second overdrive voltage to each of the bit lines.

8. The semiconductor memory device according to claim 7, wherein
   the bit line precharge circuit is configured to apply the second overdrive voltage to each of the bit lines in response to a control signal having an overdrive potential level during the bit line overdrive period, and control a potential of each of the bit lines to the second target voltage in response to the control signal reduced to a target level lower than the overdrive potential level after the bit line overdrive period is terminated.

9. The semiconductor memory device according to claim 7,
   wherein the precharge circuit includes a first switch element and a second switch element which are coupled in series between a power supply voltage terminal and each of the bit lines, and
   wherein the first switch element is turned on in response to a first control signal and the second switch element is turned off in response to a second control signal.

10. The semiconductor memory device according to claim 9, wherein
    the first switch element and the second switch element are turned on in the bit line overdrive period, and
    the second overdrive voltage is applied to a gate of the second switch element as the second control signal in the bit line overdrive period and the second target voltage is applied to the gate of the second switch element as the second control signal when the word line overdrive period is terminated.

11. The semiconductor memory device according to claim 9,
    wherein the first switch element is a P-MOS device and the second switch element is an N-MOS device.

12. The semiconductor memory device according to claim 1, wherein the control logic is configured to control the peripheral circuit such that the bit line overdrive period starts before the word line overdrive period is terminated after the word line overdrive period starts.

13. A method of operating a semiconductor memory device, comprising:
    applying a first overdrive voltage to a selected word line during a word line overdrive period;
    applying a second overdrive voltage to each of multiple bit lines during a bit line overdrive period;
    applying a first target voltage which is smaller than the first overdrive voltage to the selected word line to read data stored in memory cells connected to the selected word line after the word line overdrive period; and
    applying a second target voltage which is smaller than the second overdrive voltage to each of the multiple bit lines after the bit line overdrive period,
    wherein the word line overdrive period partially overlaps with the bit line overdrive period.

14. The method according to claim 13, wherein the first overdrive voltage is higher than the second overdrive voltage.

15. The method according to claim 13, further comprising precharging, during the bit line overdrive period, the bit lines to a pre-bit line voltage lower than the second target voltage during the application of the first overdrive voltage.

16. The method according to claim 15, further comprising, after the bit line overdrive period has terminated, increasing the bit lines in voltage from the pre-bit line voltage to the second target voltage.

\* \* \* \* \*